US011315927B2

(12) United States Patent
Mohan et al.

(10) Patent No.: US 11,315,927 B2
(45) Date of Patent: Apr. 26, 2022

(54) CELL BRIDGING TECHNIQUE

(71) Applicant: Arm Limited, Cambridge (GB)

(72) Inventors: Sreejith Mohan, Bangalore (IN); Buchupalli Venkata Chaitanya Reddy, Bangalore (IN); Abhilash Velluridathil Thazhathidathil, Bangalore (IN); Yves Thomas Laplanche, Austin, TX (US)

(73) Assignee: Arm Limited, Cambridge (GB)

( * ) Notice: Subject to any disclaimer, the term of this patent is extended or adjusted under 35 U.S.C. 154(b) by 69 days.

(21) Appl. No.: 16/387,440

(22) Filed: Apr. 17, 2019

(65) Prior Publication Data

US 2020/0335502 A1 Oct. 22, 2020

(51) Int. Cl.
 *H01L 27/092* (2006.01)
 *H01L 29/06* (2006.01)
(52) U.S. Cl.
 CPC ...... *H01L 27/0928* (2013.01); *H01L 29/0696* (2013.01)
(58) Field of Classification Search
 CPC ......... H01L 29/0696; H01L 21/823892; H01L 27/0928; H01L 27/0207; H01L 27/11807
 See application file for complete search history.

(56) References Cited

U.S. PATENT DOCUMENTS

| | | | |
|---|---|---|---|
| 8,981,491 B1* | 3/2015 | Hart | H01L 27/0207 257/372 |
| 2003/0102512 A1* | 6/2003 | Chatterjee | H01L 27/0623 257/370 |
| 2006/0164130 A1* | 7/2006 | Yoshida | H01L 27/11 327/85 |
| 2012/0061768 A1* | 3/2012 | Sasaki | H01L 29/78 257/371 |
| 2020/0007124 A1* | 1/2020 | Matsuura | H01L 21/8238 |

* cited by examiner

*Primary Examiner* — Vongsavanh Sengdara
(74) *Attorney, Agent, or Firm* — Pramudji Law Group PLLC; Ari Pramudji (57) ABSTRACT

Various implementations described herein are directed to device having a regular well cell and a flipped well cell. The regular well cell has a first N-well and a first P-well, and the flipped well cell has a second N-well and a second P-well in complementary relationship with the first N-well and the first P-well of the regular well cell. The device includes a bridge cell disposed between the regular well cell and the flipped well cell.

20 Claims, 9 Drawing Sheets

| | | | |
|---|---|---|---|
| Corner 410 | Side 412 | Side 412 | Corner 410 |
| North 414 | RVT Cell 402 | RVT Cell 402 | South 416 |
| North 414 | RVT Cell 402 | Bridge Cell 406 | South 416 |
| North 414 | RVT Cell 402 | LVT Cell 404 | South 416 |
| North 414 | RVT Cell 402 | Bridge Cell 406 | South 416 |
| North 414 | RVT Cell 402 | RVT Cell 402 | South 416 |
| Corner 410 | Side 412 | Side 412 | Corner 410 |

Logic Block Structure 401

CELL BRIDGING TECHNIQUE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In physical design, the fully depleted silicon-on-insulator (SOI) process supports regular-well voltage threshold (RVT) devices along with flipped-well voltage threshold (FVT) devices in conventional well implementations. This coexistence of different RVT and FVT devices makes the resulting mixed VT implementations of some standard logic cells challenging within a same logic block.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to cell bridging schemes and techniques that enable mixed VT implementation in a same logic block. For instance, the cell bridging schemes and techniques described herein refer to bridging regular well cells and flipped well cells associated with standard cells. As such, a bridge cell may be a structure that is designed in a way that the well orientation is opposite on either side of the bridge cell. This reciprocal orientation enables the bridge cell to abut the flipped well cell on one side of the bridge cell boundary and also to abut the conventional (or regular) well cell on another opposite side of the bridge cell boundary. Without use of the bridge cell, different VT cells are typically implemented in separate logic blocks. As such, the bridge cell structure described herein may allow area efficient abutment of different VT cells, such as, e.g., LVT cells and RVT cells. For instance, the cell bridging schemes and techniques described herein allow for different VT cell abutment, if placed between different VT cells. Also, the cell bridging schemes and techniques described herein allow for different VT block abutment, if placed between logic blocks.

In addition, the cell bridging schemes and techniques described herein may provide for area equivalency to a layout finishing cell of a logic block, and it also allows well biasing to be applied to both regular well cells and flipped well cells in the physical design, which may improve power, performance, and area (PPA) of a logic cell along with various components thereof. Also, the bridge cell may include front-end-of-line (FEOL) layers and shared layers, such as, e.g., power rail circuitry based on the cell architecture. The bridge cell may also be enhanced with integrated well taps that may resolve well isolation and latch-up violations. In some instances, the bridge cell may take the same space as traditional filler cells, which may lead to a limited area increase close to zero. Also, the bridge cell may allow similar well biasing to be applied to both regular well cells and flipped well cells in the physical design.

Various implementations of cell bridging schemes and techniques in physical design will now be described in greater detail herein with reference to FIGS. 1A-5.

Figure 1A:
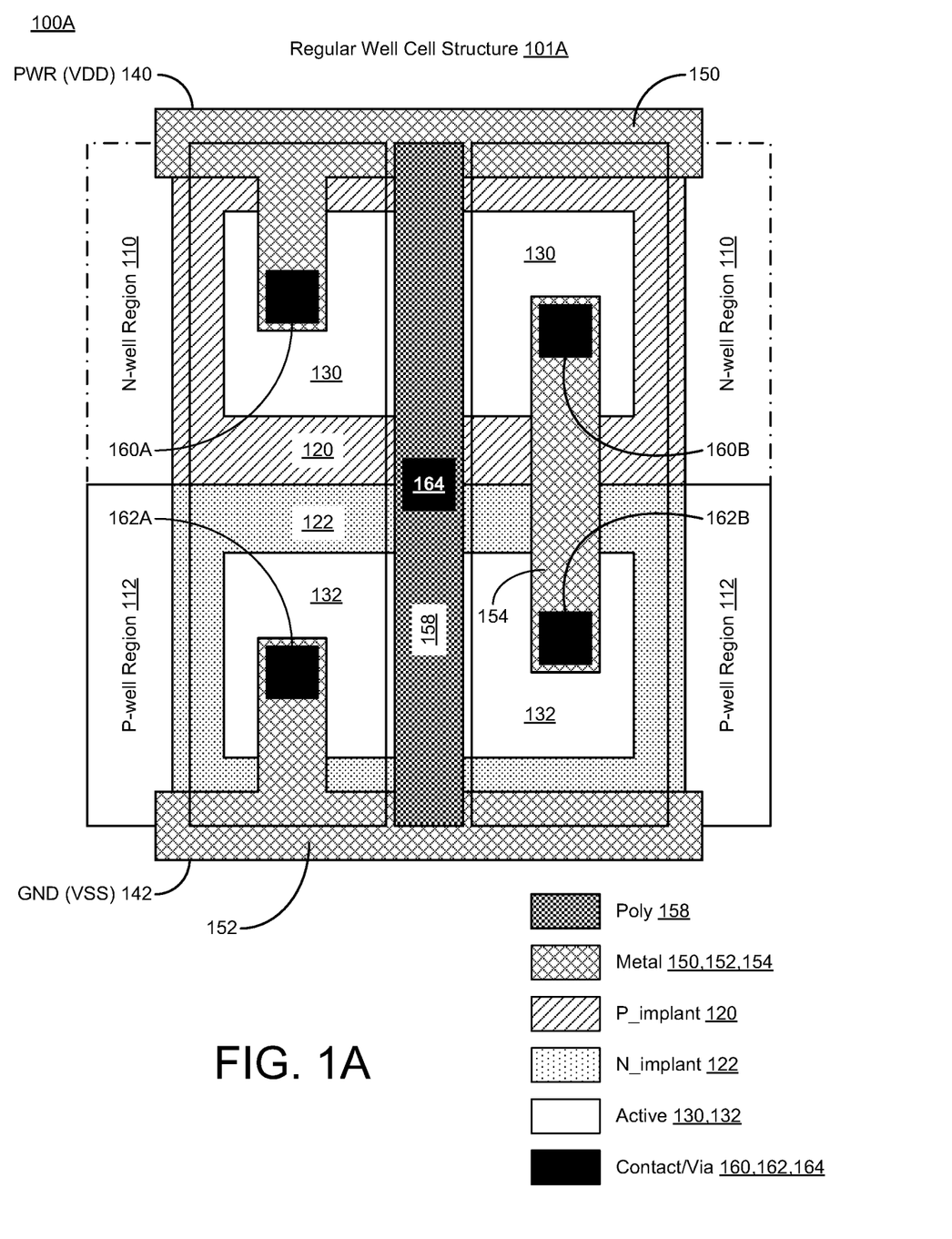
FIGS. 1A-1B illustrate top view diagrams of cell structures in accordance with implementations described herein.
Figure 1B:
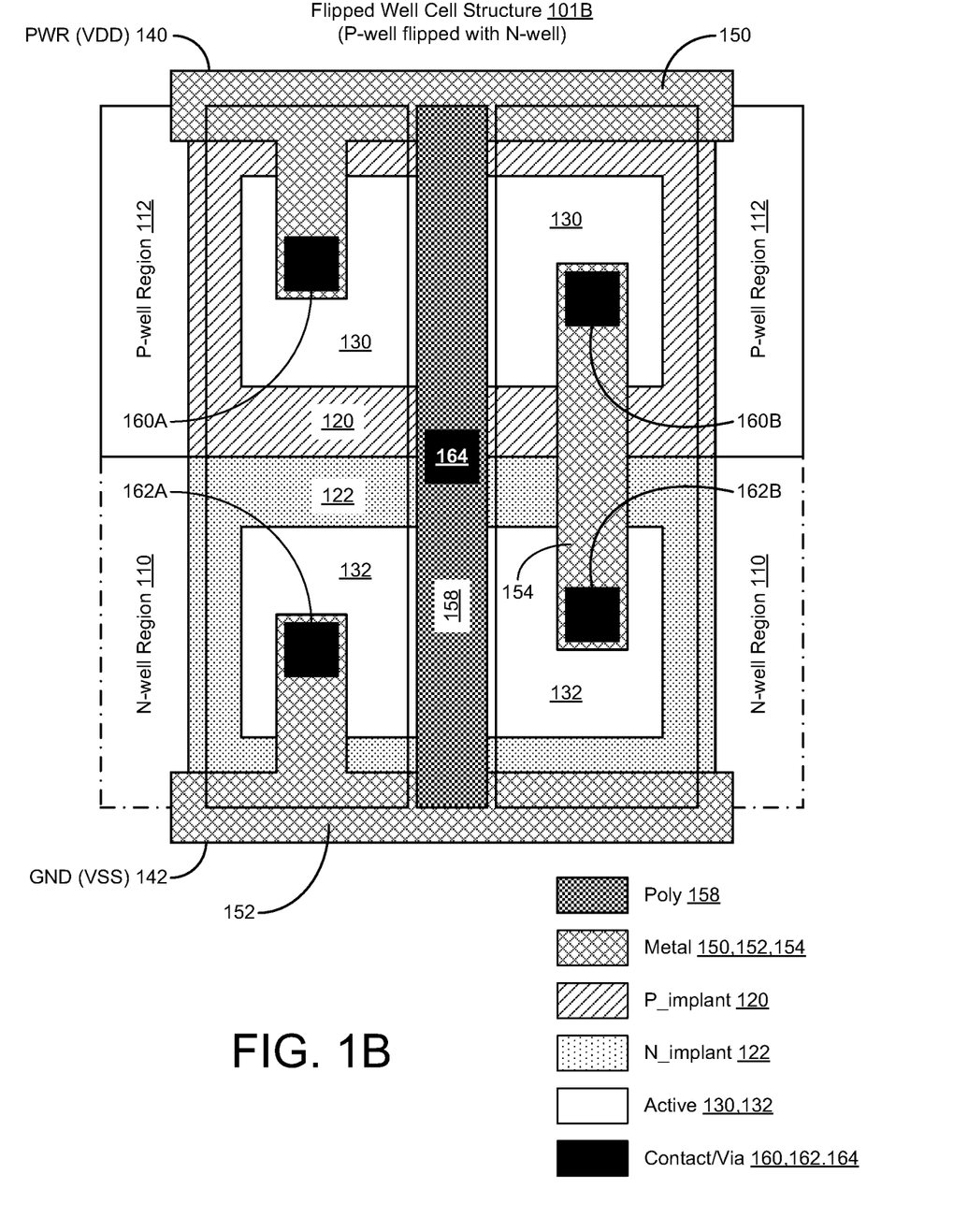

FIGS. 1A-1B illustrate top view diagrams 100A, 100B of various cell structures 101A, 101B in accordance with various implementations described herein. In particular, FIG. 1A illustrates a diagram 100A of a regular well cell structure 101A, and FIG. 1B illustrates another diagram 100B of a flipped well cell structure 101B. In some instances, as shown, the flipped well cell structure 101B in FIG. 1B has a P-well that is flipped with an N-well when compared to the regular well cell structure 101A of FIG. 1A. Also, any logic function may be implemented on either of the well cell structures 101A, 101B.

In reference to FIG. 1A, the regular well cell structure 101A is shown with an instance of a cell. As shown, the regular well cell structure 101A may include a first region 110 designated for a first type of implant and a second region 112 designated for a second type of implant that is different than the first type of implant. The regular well cell structure 101A may include a cell area having a cell boundary that is defined by the first and second regions 110, 112. In some instances, the cell boundary may define a cell width and a cell height of the regular well cell structure 101A. The first region 110 may include an N-type well region, and the second region 112 may include a P-type well region. Further, the first type of implant 120 may include a P-type implant, and the second type of implant 122 may include an N-type implant.

As shown in FIG. 1A, the regular well cell structure 101A may be configured to implant the first region 110 (e.g., N-well region) with the first type of implant 120 (e.g., P-type implant). The regular well cell structure 101A may be configured to enclose a first active region 130 of the regular well cell structure 101A within its boundary. The regular well cell structure 101A may be electrically coupled to a first potential 140 (PWR or VDD) having a first polarity via a first metal wire 150 and a first contact or via 160A. For instance, the first potential may be a power supply voltage (PWR or VDD), and the first polarity may have a positive polarity (+). In some instances, the first metal wire 150 may be referred to as a metal wiring layer, such as, e.g., an M1 metal layer. In addition, the first active region 130 may be referred to as a first active diffusion (OD) region, and the conductive contact or via 160A may be referred to as a first contact (CO) region. The conductive contact or via 160A may also be an interconnect or any other conductive type.

Also, the regular well cell structure 101A may be configured to implant the second region 112 (e.g., P-well region) with the second type of implant 122 (e.g., N-type implant). The regular well cell structure 101A may be configured to enclose a second active region 132 of the regular well cell structure 101A within its boundary. The regular well cell structure 101A may be electrically coupled to a second potential 142 (GND or VSS) having a second polarity via a second metal wire 152 and a second contact or via 162A. For instance, the second potential refers to a ground voltage (GND or VSS), and the second polarity may have a zero voltage (0V) or a negative polarity (−). In some instances, the second metal wire 152 may be referred to as a metal wiring layer, such as, e.g., an M1 metal layer. In addition, the second active region 132 may be referred to as a second active diffusion (OD) region, and also, the conductive contact or via 162A may be referred to as a second contact (CO) region.

Also, the first active region 130 may be electrically coupled to the second active region 132 with a third metal wire 154 and other conductive contacts or vias 160B, 162B. In some instances, the third metal wire 154 may be referred to as a metal wiring layer, such as, e.g., an M1 metal layer, and also, the other conductive contacts or vias 160B, 162B may be referred to as third contact (CO) regions. In addition, a poly-silicon region 158 may be used for a poly-silicon gate formation of gate connections associated with the NMOS and PMOS device regions, and the contact/via 164 may be used as a gate contact for the NMOS and PMOS device regions.

In reference to FIG. 1B, the flipped well cell structure 101B is similar to the regular well cell structure 101A of FIG. 1A, except that the P-well region 112 is flipped with the N-well region 110 when compared to the regular well cell structure 101A of FIG. 1A. In various instances, the term "flipped" may refer to a complementary relationship or reciprocal relationship. For instance, when comparing FIGS. 1A-1B, the flipped well cell structure 101B shown in FIG. 1B may have the N-well region 110 in a complementary relationship with the N-well region 110 of the regular well cell structure 101A shown in FIG. 1A. In another instance, the flipped well cell structure 101B has the N-well region 110 and the P-well region 112 reciprocally disposed with respect to the N-well region 110 and the P-well 112 of the regular well cell structure 101A.

In various implementations, the regular well cell structure 101A may refer to a regular voltage threshold (RVT) device, and the flipped well cell structure 101B may refer to a low voltage threshold (LVT) device. In some instances, the regular well cell structures may be configured as high voltage threshold (HVT) devices, and also, in other instances, the flipped well cell structures 101B may be configured as super low voltage threshold (SLVT) devices or ultra low voltage threshold (ULVT) devices.

Figure 2A:
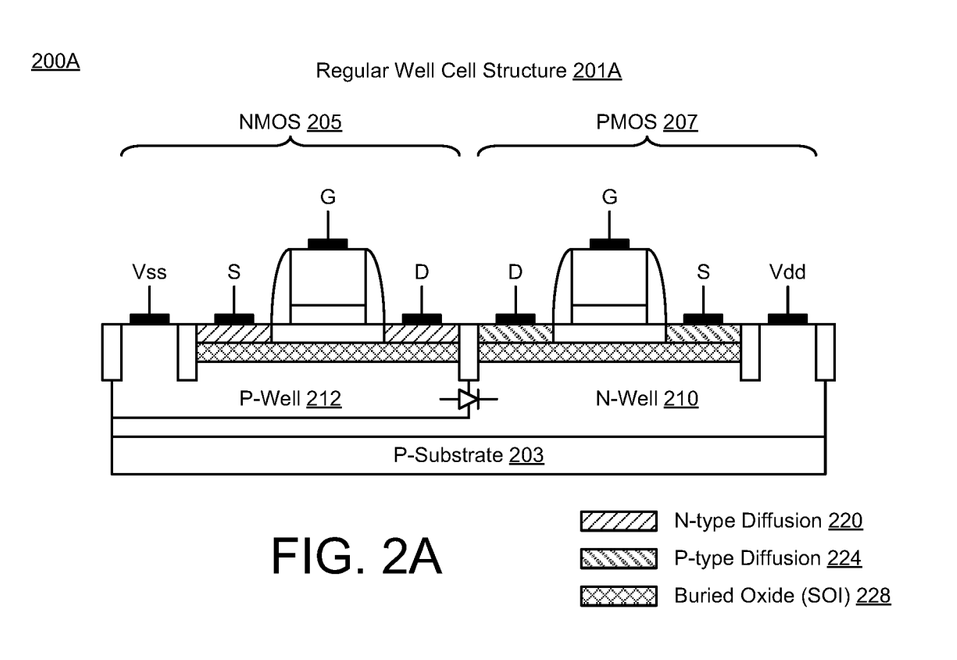
FIGS. 2A-2B illustrate cross-sectional view diagrams of the cell structures in accordance with implementations described herein.
Figure 2B:
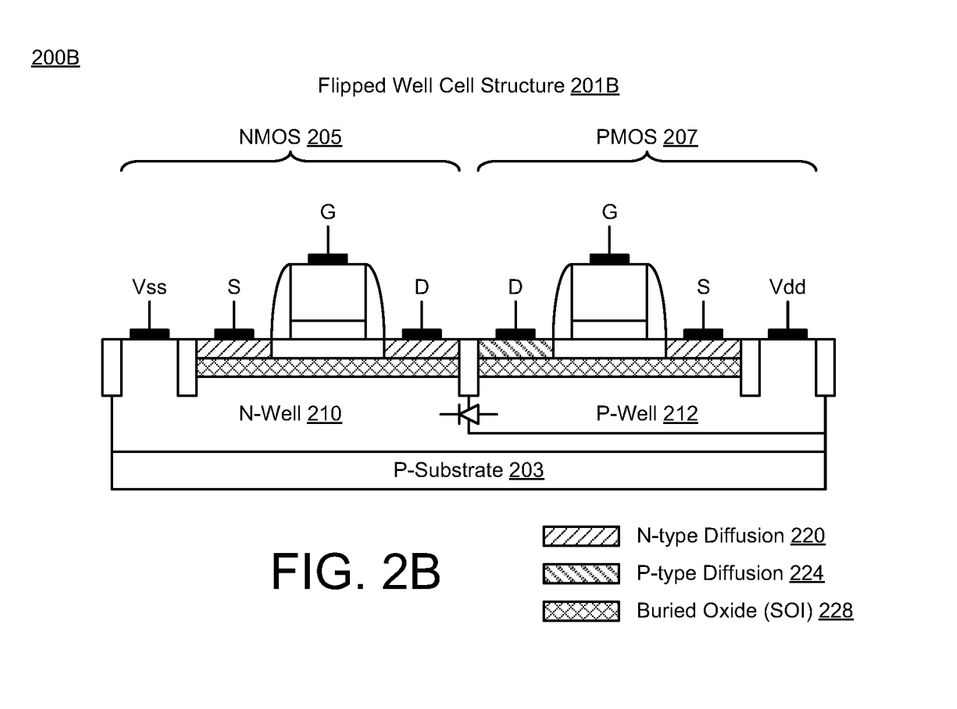

FIGS. 2A-2B illustrate cross-sectional view diagrams 200A, 200B of various cell structures 201A, 201B in accordance with various implementations described herein. In particular, FIG. 2A illustrates a diagram 200A of a regular well cell structure 201A, and FIG. 2B illustrates another diagram 200B of a flipped well cell structure 201B. As shown, the flipped well cell structure 201B in FIG. 2B has a P-well that is flipped with an N-well when compared to the regular well cell structure 201A of FIG. 2A. Also, the cell structures 201A, 201B of FIGS. 1A-1B have similar features and component parts as the cell structures 101A, 101B of FIGS. 1A-1B.

In reference to FIG. 2A, the regular well cell structure 201A is shown with an instance of a cell disposed on a substrate 203. As shown, the regular well cell structure 201A may include an N-well region 210 that is designated for a first type of implant (e.g., P-type implant) and a P-well region 212 that is designated for a second type of implant (e.g., N-type implant) that is different than the first type of implant. The regular well cell structure 201A provides for a first type of device (e.g., NMOS device 205) and for a second type of device (e.g., PMOS device 207). The NMOS device 205 has a source (S), a gate (G), and a drain (D) with the source (S) coupled to ground (GND or VSS). Also, the PMOS device 207 has a source (S), a gate (G), and a drain (D) with the source (S) coupled to the power supply voltage (PWR or VDD). Also, the NMOS and PMOS devices 205, 207 have N-type diffusion regions 220 and P-type diffusion regions 224, respectively, and the NMOS and PMOS devices 205, 207 also have buried oxide regions 228, which may be referred to as silicon-on-insulator (SOI) regions.

In reference to FIG. 2B, the flipped well cell structure 201B in FIG. 2B is similar to the regular well cell structure 201A of FIG. 2A, except that the P-well region 212 is flipped with the N-well region 210 when compared to the regular well cell structure 201A of FIG. 2A. As described herein, the term "flipped" may refer to a complementary relationship or reciprocal relationship. For instance, when comparing FIGS. 2A-2B, the flipped well cell structure 201B shown in FIG. 2B may have the N-well region 210 in a complementary relationship with the N-well region 210 of the regular well cell structure 201A shown in FIG. 2A. Also, in another instance, the flipped well cell structure 201B has the N-well region 210 and the P-well region 212 reciprocally disposed with respect to the N-well region 210 and the P-well 212 of the regular well cell structure 201A.

Figure 3A:
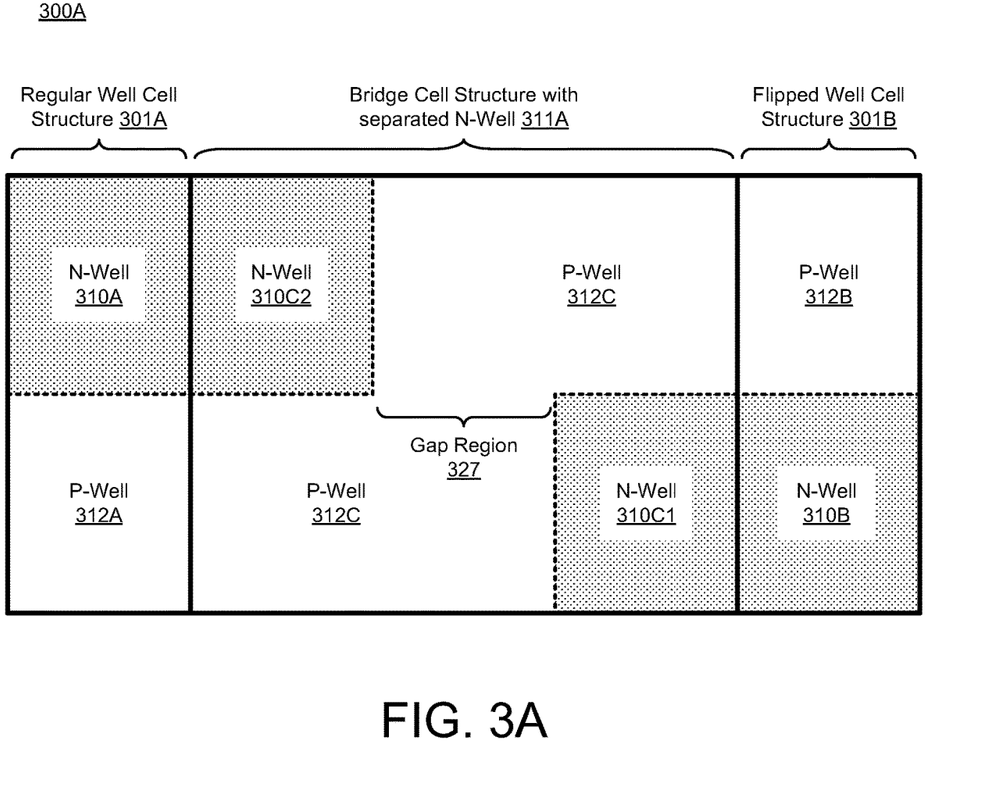
FIGS. 3A-3D illustrate various implant layout diagrams of the cell structures in accordance with implementations described herein.
Figure 3B:
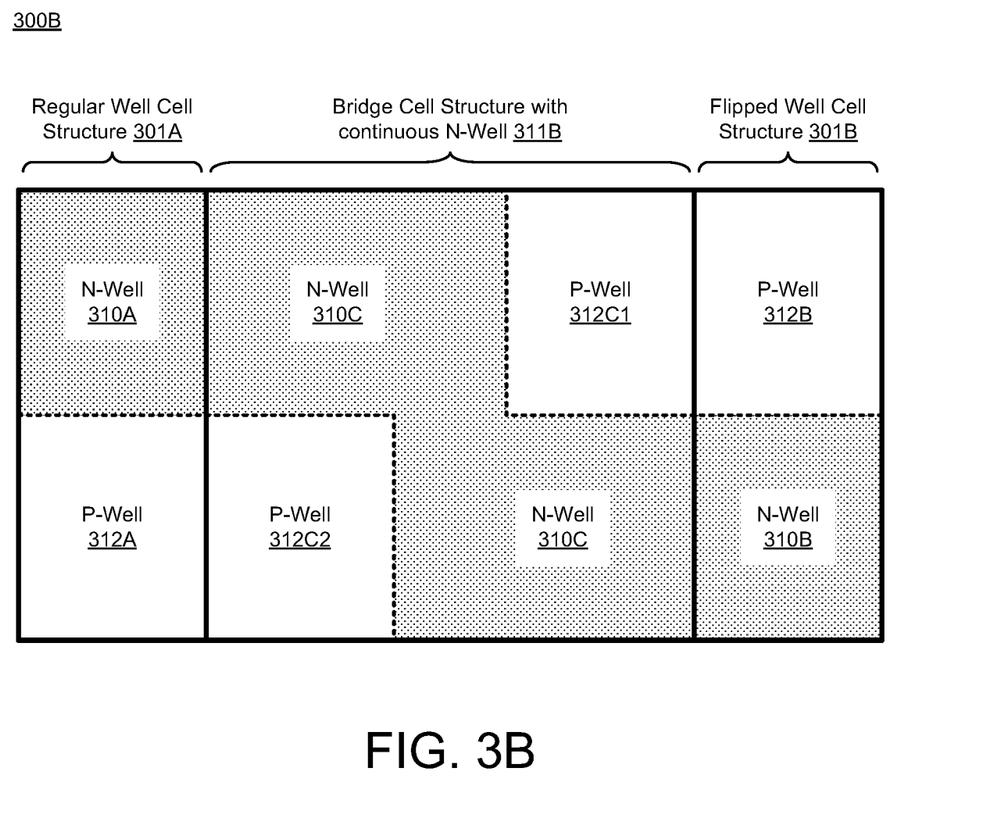
Figure 3C:
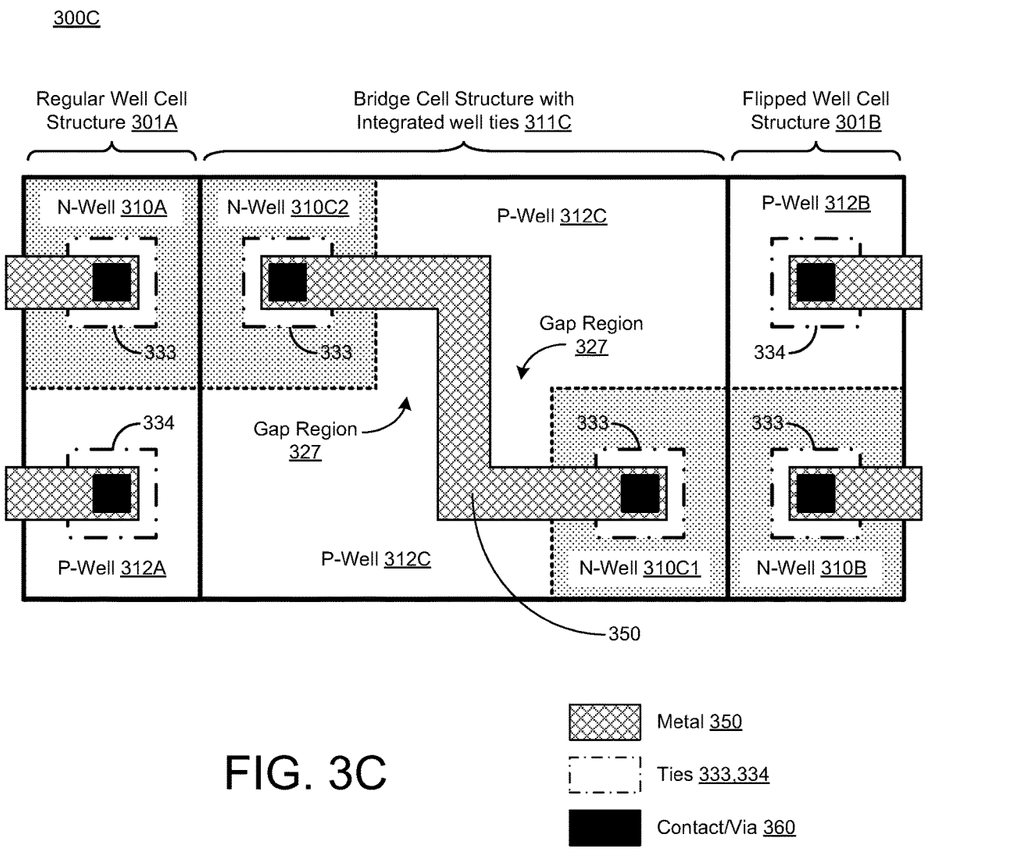
Figure 3D:
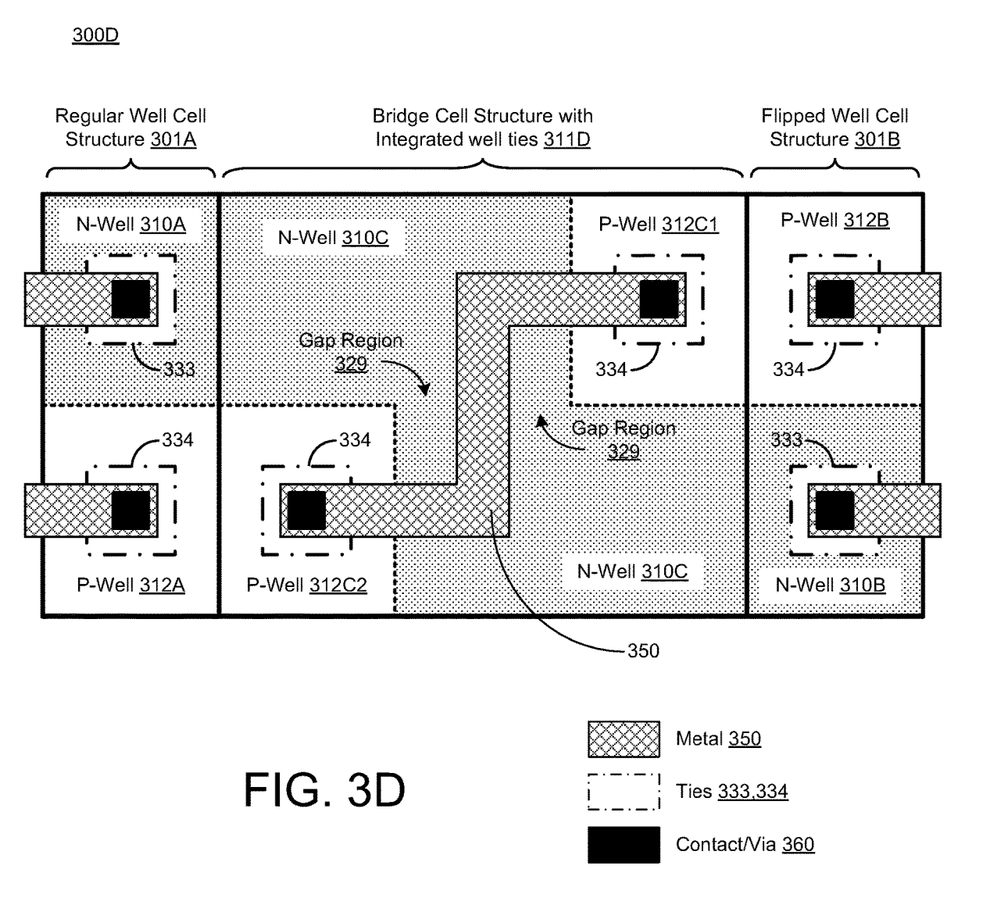

FIGS. 3A-3D illustrate various implant layout diagrams 300A, 300B, 300C, 300D of various cell structures in accordance with various implementations described herein. The cell structures may be referred to as devices or integrated circuits, and the cell structures may vary with design rules in some process technologies. In particular, FIG. 3A shows a first implant layout diagram 300A of various cell structures, FIG. 3B shows a second implant layout diagram 300B of the various cell structures, FIG. 3C shows a third implant layout diagram 300C of the various cell structures, and FIG. 3D shows a fourth implant layout diagram 300D of the various cell structures. In addition, the cell structures of FIGS. 3A-3C have similar scope, features and component parts as the cell structures of FIGS. 1A-1B and FIGS. 2A-2B.

In FIGS. 3A-3D, the cell structures include a bridge cell structure that may be referred to as a VT bridge cell (VBC) that may serve as a bridge between different types of cell structures, such as, e.g., a regular well cell structure (RVT) and a flipped well cell structure (LVT). The VBC allows for mixed VT implementation within a same logic block for processes with different well orientations across VT variants. In various instances, the bridge cell enables horizontal abutment and/or vertical abutment with regular well cell and flipped well cells. Also, the bridge cell may refer to a VT bridge tie cell, wherein the bridge cell may be enhanced with integrated well taps.

As shown in FIG. 3A, the first implant layout diagram 300A includes a regular well cell structure 301A, a flipped well cell structure 301B, and a bridge cell structure 311A with separated N-wells. For instance, the regular well cell structure 301A has an N-well 310A and a P-well 312A, and the flipped well cell structure 301B also has an N-well 310B and a P-well 312B with a reciprocal orientation (or complementary layout relationship) as the regular well cell structure 301A. The bridge cell structure 311A has multiple N-wells 310C1, 310C2 and at least one P-well 312C. In this instance, the multiple N-wells 310C1, 310C2 are arranged in diagonally opposing corners of the bridge cell structure 311A, and the P-well 312C provides for a continuous region disposed between the multiple N-wells 310C1, 310C2. As shown, the continuous region of the P-well 312C may be disposed in diagonally opposing corners of the bridge cell structure 311A in a reciprocal orientation (or complementary layout relationship) as the N-wells 310C1, 310C2.

In some implementations, the bridge cell structure 311A may have a gap region 327 that provides an area of separation between the third N-well 310C1 and the fourth N-well 310C2. The bridge cell structure 311A may also have a continuous P-well region (as shown with the P-well 312C) that provides an area of continuity between the third N-well 310C1 and the fourth N-well 310C2.

As shown in FIG. 3B, the second implant layout diagram 300B includes the regular well cell structure 301A, the flipped well cell structure 301B, and another bridge cell structure 311B with continuous N-wells. For instance, the bridge cell structure 311B has multiple P-wells 312C1, 312C2 and at least one N-well 310C that may be disposed in a continuous region between the multiple P-wells 312C1, 312C2. In this instance, the multiple P-wells 312C1, 312C2 are arranged in diagonally opposing corners of the bridge cell structure 311B, and the N-well 310C provides for a continuous region that is disposed between the multiple P-wells 312C1, 312C2. As shown, the continuous N-well 310C may be disposed in diagonally opposing corners of the bridge cell structure 311B in a reciprocal orientation (or complementary layout relationship) as the P-wells 312C1, 312C2.

As shown in FIG. 3C, the third implant layout diagram 300C is similar to the the first implant layout diagram 300A of FIG. 3A with the addition of ties 333, 334 and metal wiring 350. In some implementations, the regular well cell structure 301A has a first N-well 310A and a first P-well 312A, and the flipped well cell structure 301B has a second N-well 310B and a second P-well 312B that is in complementary relationship with the first N-well 310A and the first P-well 312A of the regular well cell structure 301A. The bridge cell 311C may be disposed between the regular well cell structure 301A and the flipped well cell structure 301B. In this instance, the bridge cell structure 311C may have multiple N-wells 310C1, 310C2 in diagonally opposing corners including a third N-well 310C1 that is disposed adjacent to the first P-well 312A of the regular well cell structure 301A and a fourth N-well 310C2 that is disposed adjacent to the second P-well 312B of the flipped well cell structure 301B. Also, the second N-well 310B and the second P-well 312B of the flipped well cell structure 301B are reciprocally disposed in orientation with respect to the first N-well 310A and the first P-well 312A of the regular well cell structure 301A. Further, the bridge cell structure 311C has at least one continuous P-well 312C. In this instance, the multiple N-wells 310C1, 310C2 are arranged in diagonally opposing corners of the bridge cell structure 311A, and the P-well 312C provides for a continuous region disposed between the multiple N-wells 310C1, 310C2. In some instances, the first P-well 312A, the second P-well 312B, and the continuous P-well 312C are P-type implant regions.

The regular well cell structure 301A has integrated well ties 333, 334 that may be formed as part of the first N-well 310A and a first P-well 312A, respectively. The flipped well cell structure 301B also has integrated well ties 333, 334 that may be formed as part of the second N-well 310B and a second P-well 312B, respectively. In some instances, metal lines or metal wiring 350 may be used to provide conductive connections between two well contacts of separated N-wells. Also, the P-well 312C is continuous, and as such, one P-well tie may connect the entire P-well region to its corresponding potential.

The bridge cell structure 311C has the gap region 327 that provides an area of separation between the third N-well 310C1 and the fourth N-well 310C2. Also, as shown, the bridge cell structure 311C has a continuous P-well region that provides an area of continuity between the third N-well 310C1 and the fourth N-well 310C2. The bridge cell structure 311C has integrated well ties 333 that may be formed as an integral part of the third N-well 310C1 and the fourth N-well 310C2. The bridge cell structure 311C has well contacts 360 that may be formed on the third N-well 310C1 and the fourth N-well 310C2, and the bridge cell structure 311C has a conductive line 350 (or metal wiring) that may be used to electrically couple the well contacts 360 together. In some instances, the first N-well 310A, the second N-well 310B, the third N-well 310C1 and the fourth N-well 310C2 are N-type well regions. Also, the regular well cell structure 301A has the first P-well 312A disposed opposite to the first N-well 310A, and the flipped well cell structure 301B has the second P-well 312B disposed in a complementary relationship with the first P-well 312A of the regular well cell 301A.

As discussed in reference to FIG. 3B, the bridge cell structure 311B may have multiple P-wells 312C1, 312C2 disposed in diagonally opposing corners. For instance, in alternative implementations of FIG. 3C, the bridge cell structure 311C may have a third P-well 312C1 that is disposed adjacent to the first N-well 310A of the regular well cell structure 301A, and the bridge cell structure 311C may have a fourth P-well 312B that is disposed adjacent to the second N-well 310B of the flipped well cell structure 301B. In this instance, the first P-well 312A, the second P-well 312B, the third P-well 312C1 and the fourth P-well 312C2 are P-type implant regions.

In some implementations, as shown in FIG. 3D, the bridge cell structure 311D may have at least one continuous N-well 310C. As shown, the multiple P-wells 312C1, 312C2 are arranged in diagonally opposing corners of the bridge cell structure 311D, and the N-well 310C provides for a continuous region disposed between the multiple P-wells 312C1, 312C2. In some instances, the first P-well 312A, the second P-well 312B, and the multiple P-wells 312C1, 312C2 are P-type implant regions, and the first N-well 310A, the second P-well 310B, and the continuous N-well 310C are N-type implant regions. Also, the bridge cell structure 311C may have a gap region 329 that provides an area of separation between the third P-well 312C1 and the fourth P-well 312C2. The bridge cell structure 311C may also have the continuous N-well region 310C that provides an area of continuity between the third P-well 312C1 and the fourth P-well 312C2. The bridge cell structure 311D has integrated well ties 334 that may be formed as an integral part of the third P-well 312C1 and the fourth P-well 312C2. The bridge cell structure 311D has well contacts 360 that may be formed on the third P-well 312C1 and the fourth P-well 312C2, and the bridge cell structure 311D has a conductive line 350 (or metal wiring) that may be used to electrically couple the well contacts 360 together.

Figure 4:
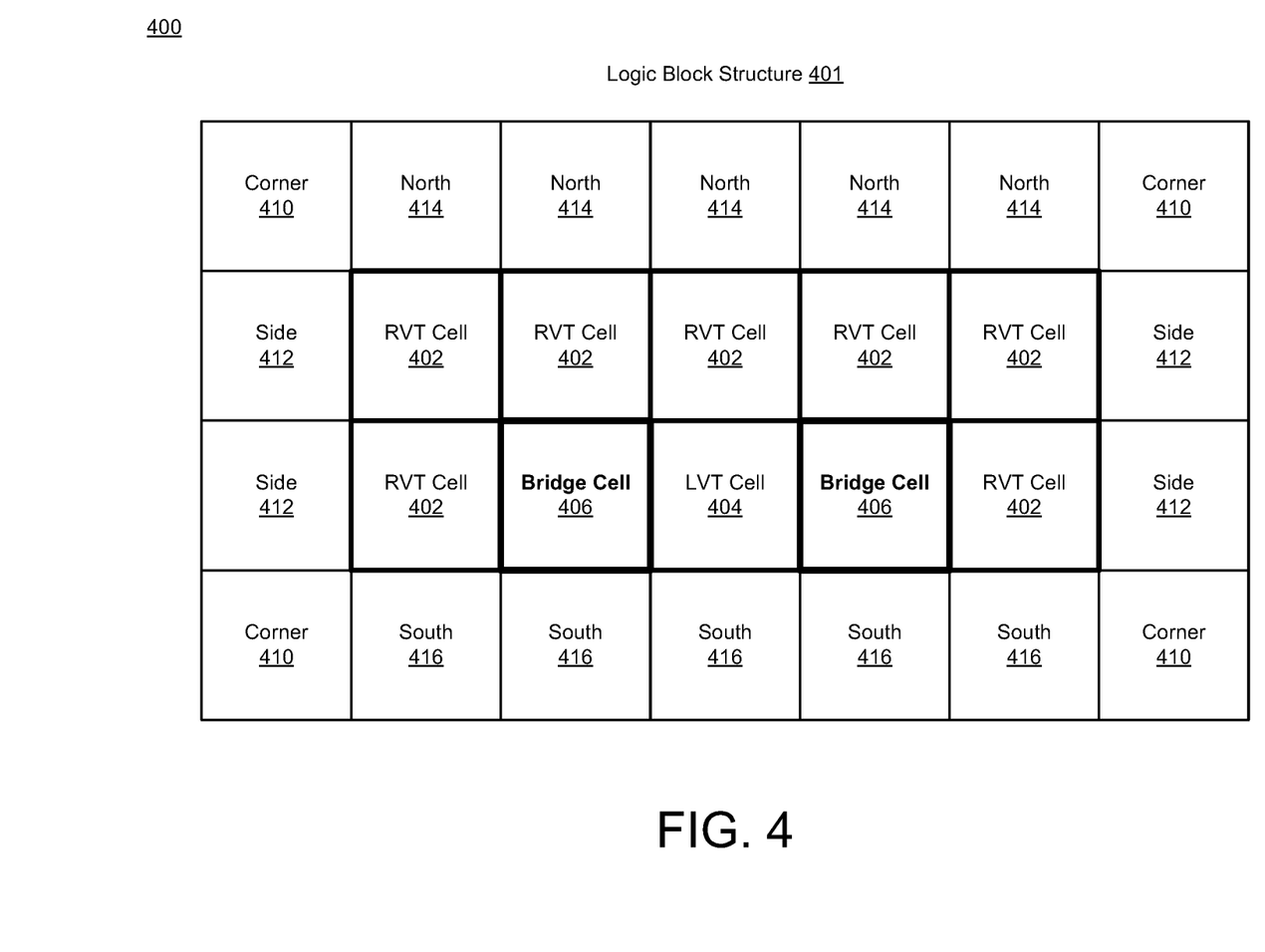
FIG. 4 illustrates a layout diagram of a logic block structure in accordance with implementations described herein.

FIG. 4 illustrates a logic block layout diagram 400 of a logic block structure 401 in accordance with implementations described herein.

As shown in FIG. 4, the logic block structure 401 may include a logic block that is arranged (and/or abutted) in rows and columns along with specially designed boundary cells, such as, e.g., corner cells 410, side cells 412, north cells 414, and south cells 416. As shown, the boundary cells 410, 412, 414, 416 are inserted on either side of RVT cells 402 and LVT cells 404 to finish the logic block structure 401 and isolate the RVT cells 402 and the LVT cells 404 from other blocks. The isolation may be in the horizontal and vertical directions. As described herein, the RVT cells 402 may refer to regular well cell structures, and the LVT cells 404 may refer to flipped well cell structures. Also, as described herein, one or more bridge cells 406 may be used to provide a bridge (or bridge cell structure) between the regular well cell structures (RVT cells 402) and the flipped well cell structures (LVT cells 404). The logic block structure 401 may include the bridge cells 406 disposed between the RVT cells 402 and the LVT cells 404. The logic block structure 401 may include corner cells 410, side cells 412, north cells 414 and south cells 416 that may be referred to as boundary cells or layout finishing cells. These cells 410, 412, 414, 416 are non-functional cells that are designed to legalize the boundary of the logic block once the RVT cells 402, the LVT cells 404 and the bridge cells 406 are abutted.

Figure 5:
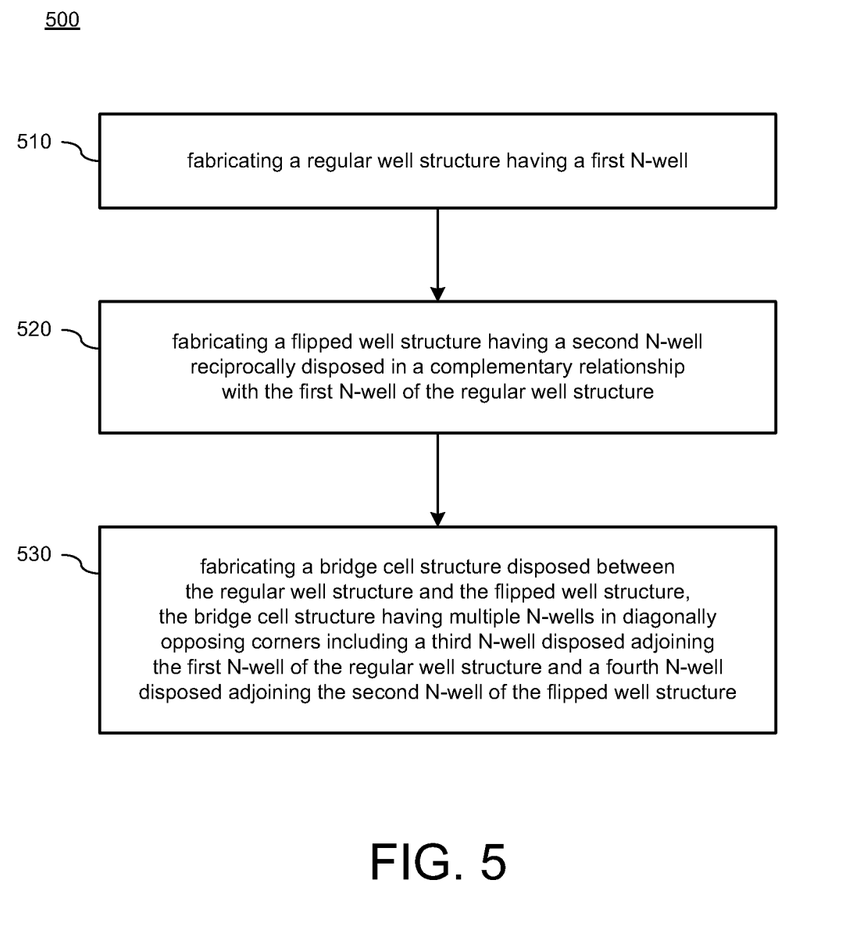
FIG. 5 illustrates a process diagram of a method for providing a cell bridge in accordance with various implementations described herein.

FIG. 5 illustrates a process flow diagram of a method 500 for providing a cell bridge in accordance with various implementations described herein.

It should be understood that even though method 500 may indicate a particular order of execution of operations, in some instances, certain portions of operations may be executed in a different order, and on different systems. In other instances, additional operations or steps may be added to and/or omitted from method 500. Also, a computing device may be configured to perform method 500. As such, in some instances, method 500 may be implemented as a program or software instruction process that is configured to provide various cell bridging schemes and techniques as described herein.

At block 510, method 500 may fabricate a regular well structure having a first N-well and a first P-well. At block 520, method 500 may fabricate a flipped well structure having a second N-well and a second P-well reciprocally disposed in a complementary relationship with the first N-well and the first P-well of the regular well structure.

At block 530, method 500 may fabricate a bridge cell structure that is disposed between the regular well structure and the flipped well structure. The bridge cell structure includes multiple N-wells in diagonally opposing corners including a third N-well disposed adjoining the first P-well of the regular well structure and also a fourth N-well disposed adjoining the second P-well of the flipped well structure.

In some implementations, the bridge cell structure may have a gap region that provides an area of separation between the third N-well and the fourth N-well. The bridge cell structure may also have a continuous P-well region that provides an area of continuity between the third N-well and the fourth N-well. Also, the bridge cell structure may have integrated well ties formed as an integral part of the third N-well and the fourth N-well. In some instances, the bridge cell structure may have well contacts formed on the third N-well and the fourth N-well, and the bridge cell structure may have a conductive line that electrically couples the N-well well contacts together. In other instances, the bridge cell structure may have well contacts formed on the third P-well and the fourth P-well, and the bridge cell structure may have another conductive line that electrically couples the P-well well contacts together.

The various the cell bridging schemes and techniques described herein provide for advantageous mixed VT implementation that may improve power, performance and area (PPA). In some instances, the VT Bridge cell (VBC) may remove, prevent or at least inhibit the need for two separate logic blocks, such as one logic block for the regular well cells and another separate logic block for the flipped well cells. Also, at various given well bias voltages, the regular well cells may have reduced leakage, and the flipped well cells may have performance gains.

Described herein are various implementations of a device. The device may include a regular well cell having a first N-well and a first P-well. The device may include a flipped well cell having a second N-well and a second P-well in complementary relationship with the first N-well and the first P-well of the regular well cell. The device may include a bridge cell disposed between the regular well cell and the flipped well cell, and the bridge cell may include multiple N-wells in diagonally opposing corners.

Described herein are various implementations of a device. The device may include a first well structure having a first N-well and a first P-well. The device may include a second well structure having a second N-well and a second P-well reciprocally disposed with respect to the first N-well and the first P-well of the first well structure. The device may include a third well structure disposed between the first well structure and the second well structure, and the third well structure may include multiple N-wells in diagonally opposing corners and at least one P-well.

Described herein are various implementations of a device. The device may include a regular well cell having a first N-well and a first P-well. The device may include a flipped well cell having a second N-well and a second P-well in complementary relationship with the first N-well and the first P-well of the regular well cell. The device may include a bridge cell disposed between the regular well cell and the flipped well cell, and the bridge cell may have multiple P-wells in diagonally opposing corners.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
    a first well cell having a first P-type metal-oxide-semiconductor (MOS) device with a first N-well and a first N-type MOS device with a first P-well;
    a second well cell having a second PMOS device with a second N-well and a second NMOS device with a second P-well in complementary relationship with the first N-well and the first P-well of the first well cell; and
    a bridge cell disposed between the first well cell and the second well cell, the bridge cell having multiple N-wells disposed in diagonally opposing corners that adjoin the first N-well and the second N-well, the bridge cell having a continuous P-well that adjoins the first P-well and the second P-well.

2. The device of claim 1, wherein the second N-well and the second P-well of the second well cell are reciprocally disposed in orientation with respect to the first N-well and the first P-well of the first well cell.

3. The device of claim 1, wherein the multiple N-wells include a third N-well disposed adjacent to the first N-well of the first well cell and a fourth N-well disposed adjacent to the second N-well of the second well cell.

4. The device of claim 3, wherein the bridge cell has a gap region that provides an area of separation between the third N-well and the fourth N-well.

5. The device of claim 3, wherein the bridge cell has the continuous P-well region that provides an area of continuity between the third N-well and the fourth N-well.

6. The device of claim 3, wherein the bridge cell has integrated well ties formed as an integral part of the third N-well and the fourth N-well.

7. The device of claim 3, wherein the bridge cell has well contacts formed on the third N-well and the fourth N-well, and wherein the bridge cell has a conductive line that electrically couples the well contacts together.

8. The device of claim 3, wherein the first N-well, the second N-well, the third N-well and the fourth N-well are N-type implant regions.

9. The device of claim 1, wherein:
    the first well cell has the first P-well disposed opposite to the first N-well, and
    the second well cell has the second P-well disposed in complementary relationship with the first P-well of the first well cell.

10. The device of claim 9, wherein:
the bridge cell has the multiple N-wells in diagonally opposing corners including a third N-well disposed adjacent to the first N-well of the first well cell and a fourth N-well disposed adjacent to the second N-well of the second well cell, and
the first N-well, the second N-well, the third N-well and the fourth N-well are N-type implant regions, and
the bridge cell has the continuous P-well region disposed in diagonally opposing corners between the third N-well and the fourth N-well.

11. A device, comprising:
a first well structure having a first P-type metal-oxide-semiconductor (MOS) device with a first N-well and a first N-type MOS device with a first P-well;
a second well structure having a second PMOS device with a second N-well and a second NMOS device with a second P-well reciprocally disposed with respect to the first N-well and the first P-well of the first well structure; and
a third well structure disposed between the first well structure and the second well structure, the third well structure having multiple N-wells disposed in diagonally opposing corners and at least one continuous P-well, wherein the multiple N-wells adjoin the first N-well and the second N-well, and wherein the at least one continuous P-well adjoins the first P-well and the second P-well.

12. The device of claim 11, wherein:
the multiple N-wells include a third N-well disposed adjacent to the first N-well of the first well structure,
the multiple N-wells include a fourth N-well disposed adjacent to the second N-well of the second well structure,
the at least one continuous P-well is disposed adjacent to the first N-well of the first well structure and the second N-well of the second well structure, and
the third well structure has a gap region that provides an area of separation between the third N-well and the fourth N-well.

13. The device of claim 12, wherein the third well structure has the at least one continuous P-well that provides an area of continuity between the third N-well and the fourth N-well.

14. The device of claim 12, wherein the third well structure has integrated well ties formed as an integral part of the third N-well and the fourth N-well.

15. The device of claim 12, wherein the third well structure has well contacts formed on the third N-well and the fourth N-well, and wherein the third well structure has a conductive line that electrically couples the well contacts together.

16. A device, comprising:
a well cell having a first P-type metal-oxide-semiconductor (MOS) device with a first N-well and a first N-type MOS device with a first P-well;
a flipped well cell having a second PMOS device with a second N-well and a second NMOS device with a second P-well in complementary relationship with the first N-well and the first P-well of the well cell; and
a bridge cell disposed between the well cell and the flipped well cell, the bridge cell having multiple P-wells disposed in diagonally opposing corners so as to adjoin the first P-well and the second P-well, the bridge cell having a continuous N-well that adjoins the first N-well and the second N-well.

17. The device of claim 16, wherein the multiple P-wells include a third P-well disposed adjacent to the first P-well of the well cell and a fourth P-well disposed adjacent to the second P-well of the flipped well cell.

18. The device of claim 17, wherein the bridge cell has a gap region that provides an area of separation between the third P-well and the fourth P-well.

19. The device of claim 17, wherein the bridge cell has the continuous N-well region that provides an area of continuity between the third P-well and the fourth P-well.

20. The device of claim 17, wherein:
the bridge cell structure has integrated well ties along with well contacts formed as an integral part of the third P-well and the fourth P-well, and
the bridge cell structure has a conductive line that electrically couples the well contacts together.

* * * * *